USO10318202B2

United States Patent
Xie et al.

(10) Patent No.: US 10,318,202 B2
(45) Date of Patent: Jun. 11, 2019

(54) NON-VOLATILE MEMORY APPARATUS AND DATA DEDUPLICATION METHOD THEREOF

(71) Applicant: VIA Technologies, Inc., New Taipei (TW)

(72) Inventors: Tingjun Xie, Sunnyvale, CA (US); Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/641,242

(22) Filed: Jul. 4, 2017

(65) Prior Publication Data

US 2018/0267733 A1 Sep. 20, 2018

Related U.S. Application Data

(60) Provisional application No. 62/474,023, filed on Mar. 20, 2017.

(51) Int. Cl.
*G06F 3/06* (2006.01)
*G06F 11/10* (2006.01)
(Continued)

(52) U.S. Cl.
CPC .......... *G06F 3/0641* (2013.01); *G06F 3/0608* (2013.01); *G06F 3/0656* (2013.01);
(Continued)

(58) Field of Classification Search
CPC .... G06F 3/0641; G06F 3/0608; G06F 3/0656; G06F 3/0679; G06F 11/1048;
(Continued)

(56) References Cited

U.S. PATENT DOCUMENTS 9,075,710 B2 * 7/2015 Talagala .............. G06F 12/0246
9,229,853 B2 * 1/2016 Khan .................... G06F 3/0608
(Continued)

OTHER PUBLICATIONS

Berman et al., Integrating De-duplication and Write for Increased Performance and Endurance of Solid-State Drives, 2010, IEEE, pp. 821-823.*

(Continued)

*Primary Examiner* — John J Tabone, Jr.
(74) *Attorney, Agent, or Firm* — JCIPRNET (57) ABSTRACT

A non-volatile memory (NVM) apparatus and a data de-duplication method thereof are provided. The NVM apparatus includes a NVM and a controller. The controller performs an error checking and correcting (ECC) method to convert a raw data into an encoded data. The controller performs the data de-duplication method to reduce a number of times that the same encoded data is repeatedly written into the NVM. The controller generates the feature information corresponding to the raw data by reusing the ECC method. When the feature information is found in a feature list, the encoded data corresponding to the raw data will not be written into the NVM. When the feature information is not found in the feature list, the feature information is added into the feature list, and the encoded data corresponding to the raw data is written into the NVM.

21 Claims, 5 Drawing Sheets

(51) Int. Cl.
*H03M 13/11* (2006.01)
*H03M 13/00* (2006.01)
*H03M 7/30* (2006.01)

(52) U.S. Cl.
CPC ........ *G06F 3/0679* (2013.01); *G06F 11/1048* (2013.01); *G06F 11/1076* (2013.01); *H03M 7/3091* (2013.01); *H03M 13/1102* (2013.01); *H03M 13/1128* (2013.01); *H03M 13/1148* (2013.01); *H03M 13/6312* (2013.01); *H03M 13/6502* (2013.01)

(58) Field of Classification Search
CPC ............. G06F 11/1076; H03M 7/3091; H03M 13/1102; H03M 13/1128; H03M 13/1148; H03M 13/6312; H03M 13/6502
USPC ......... 714/764.763, 768, 773, 785, 799, 800
See application file for complete search history.

(56) References Cited

U.S. PATENT DOCUMENTS

| | | | | |
|---|---|---|---|---|
| 9,246,511 | B2* | 1/2016 | Kipnis | H03M 7/30 |
| 9,251,060 | B2* | 2/2016 | Khan | G11C 16/10 |
| 9,329,928 | B2* | 5/2016 | Fitzpatrick | G06F 11/1012 |
| 9,575,661 | B2* | 2/2017 | Dor | G06F 3/0608 |
| 9,665,287 | B2* | 5/2017 | Li | G06F 3/0608 |
| 9,841,918 | B2* | 12/2017 | Erez | G06F 3/0641 |
| 9,864,542 | B2* | 1/2018 | Li | G06F 3/0608 |
| 2013/0073821 | A1* | 3/2013 | Flynn | G06F 3/061 |
| | | | | 711/162 |
| 2013/0227236 | A1* | 8/2013 | Flynn | G11C 16/26 |
| | | | | 711/165 |
| 2013/0318288 | A1* | 11/2013 | Khan | G06F 3/0608 |
| | | | | 711/103 |
| 2014/0229790 | A1* | 8/2014 | Goss | G06F 11/1048 |
| | | | | 714/755 |
| 2014/0250257 | A1* | 9/2014 | Khan | G11C 16/10 |
| | | | | 711/103 |
| 2014/0317479 | A1 | 10/2014 | Candelaria | |
| 2015/0039577 | A1* | 2/2015 | Talagala | G06F 9/467 |
| | | | | 707/703 |
| 2015/0113326 | A1* | 4/2015 | Talagala | G06F 11/1441 |
| | | | | 714/24 |
| 2015/0242309 | A1* | 8/2015 | Talagala | G06F 12/0246 |
| | | | | 711/103 |
| 2016/0139982 | A1* | 5/2016 | Yu | G11C 14/0018 |
| | | | | 714/768 |
| 2016/0203053 | A1* | 7/2016 | Talagala | H04L 67/1097 |
| | | | | 714/6.12 |
| 2016/0224253 | A1* | 8/2016 | Tuers | G06F 3/0608 |
| 2017/0131943 | A1* | 5/2017 | Le | G06F 3/0647 |
| 2017/0160978 | A1* | 6/2017 | Erez | G06F 3/0641 |
| 2017/0161202 | A1* | 6/2017 | Erez | G06F 12/0246 |
| 2018/0090184 | A1* | 3/2018 | Lee | G06F 12/1018 |

OTHER PUBLICATIONS

"Office Action of Taiwan Counterpart Application", dated Mar. 5, 2017, p. 1-p. 7, in which the listed reference was cited.

"Office Action of Taiwan Counterpart Application," dated Nov. 20, 2018, p. 1-p. 11.

* cited by examiner

NON-VOLATILE MEMORY APPARATUS AND DATA DEDUPLICATION METHOD THEREOF

CROSS-REFERENCE TO RELATED APPLICATION

This application claims the priority benefit of U.S. provisional application Ser. No. 62/474,023, filed on Mar. 20, 2017. The entirety of the above-mentioned patent application is hereby incorporated by reference herein and made a part of this specification.

BACKGROUND OF THE INVENTION

1. Field of the Invention

The invention relates to a memory apparatus, and more particularly, relates to a non-volatile memory apparatus and a data de-duplication method thereof.

2. Description of Related Art

In comparison with traditional hard disk drives, flash memory storage equipments have favorable reading/writing performance and low power consumption, and this is why the flash memories are widely applied in data storage systems. In certain storage applications, the same data may have multiple duplications in the storage equipment, and these duplications will increase a data written count. How to reduce the amount of writes while improving write performance as well as endurance is one important issue that needs to be addressed.

The existing approach can perform a compression for the data and then writes the compressed data into the flash memory. This data compression technique can reduce a data volume of duplicated data so as to reduce the amount of writes. In any case, the data volume that the data compression technique can reduce depends on data patterns. In certain applications, the data cannot be compressed at all. In other applications, the data can be well compressed. Consequently, because the data patterns are not exactly the same in terms of compressibility, the length of each data after compression may have a different change. If the each of the compressed data has a different length, the data compression may consume a lot of overload of FTL (Flash Translation Layer) just for managing the compressed data.

SUMMARY OF THE INVENTION

The invention is directed to a non-volatile memory apparatus and a data de-duplication method thereof, which are capable of reducing the number of times that the same encoded data is repeatedly written into the non-volatile memory.

A non-volatile memory apparatus is provided according to the embodiments of the invention. The non-volatile memory apparatus includes a non-volatile memory and a controller. The controller is coupled to the non-volatile memory. The controller is configured to perform an error checking and correcting (ECC) method to convert a raw data into an encoded data. The controller is configured to perform the data de-duplication method to reduce a number of times that the same encoded data is repeatedly written to the non-volatile memory. The data de-duplication method includes: generating a feature information corresponding to the raw data by reusing the ECC method; looking up a feature list using the feature information; not writing the encoded data corresponding to the raw data into the non-volatile memory when the feature information is found in the feature list; and adding the feature information corresponding to the raw data into the feature list and writing the encoded data corresponding to the raw data into the non-volatile memory when the feature information is not found in the feature list.

A data de-duplication method of a non-volatile memory apparatus is provided according to the embodiments of the invention, which is used to reduce the number of times that the same encoded data is repeatedly written into the non-volatile memory. The non-volatile memory apparatus is configured to perform an ECC method so as to convert a raw data into an encoded data. The data de-duplication method includes: generating a feature information corresponding to the raw data by reusing the ECC method; looking up a feature list using the feature information; not writing the encoded data corresponding to the raw data into the non-volatile memory when the feature information is found in the feature list; and adding the feature information corresponding to the raw data into the feature list and writing the encoded data corresponding to the raw data into the non-volatile memory when the feature information is not found in the feature list.

Based on the above, the non-volatile memory apparatus and the data de-duplication method thereof described in the embodiments of the invention can generate the feature information corresponding to the raw data by reusing the existing ECC method. Upon comparing the feature information with feature list, it can be learnt about whether the encoded data corresponding to the raw data has been written into the non-volatile memory. As a result, the non-volatile memory apparatus and the data de-duplication method thereof described in the embodiments of the invention are capable of reducing the number of times that the same encoded data is repeatedly written into the non-volatile memory.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". Moreover, elements/components/steps with same reference numerals represent same or similar parts in the drawings and embodiments. Elements/components/steps with the same reference numerals or names in different embodiments may be cross-referenced.

Figure 1:
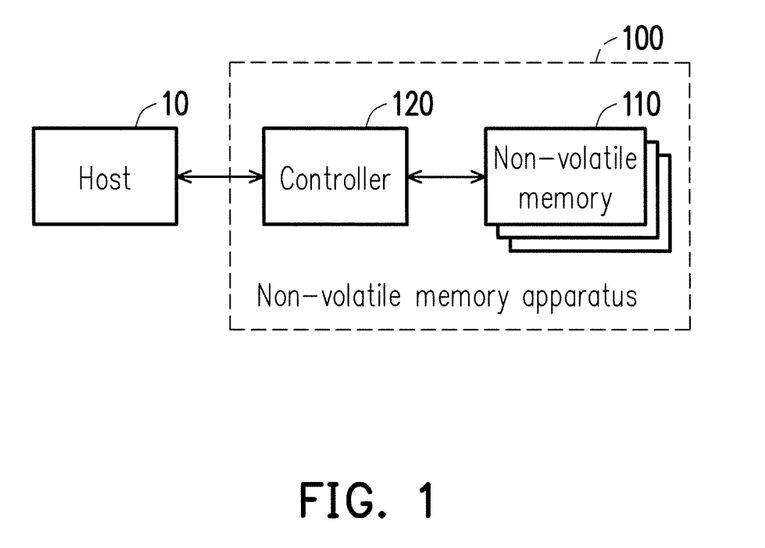
FIG. 1 is a circuit block diagram illustrating a non-volatile memory apparatus according to an embodiment of the invention.

FIG. 1 is a circuit block diagram illustrating a non-volatile memory apparatus 100 according to an embodiment of the invention. Based on design requirements, the non-volatile memory apparatus 100 may be a USB drive, a SSD (solid state disc) or other storage devices. The non-volatile memory apparatus 100 may be coupled to a host 10. The host 10 may be a computer, a handheld phone, a multimedia player, a camera or other electronic devices. When the host 10 sends a write command to the non-volatile memory apparatus 100, the non-volatile memory apparatus 100 can write a data of the host 10 into a non-volatile memory in the non-volatile memory apparatus 100 according to addressing of the write command. When the host 10 sends a read command to the non-volatile memory apparatus 100, the non-volatile memory apparatus 100 can return the corresponding data to the host 10 according to addressing of the read command.

In the embodiment shown by FIG. 1, the non-volatile memory apparatus 100 includes a non-volatile memory 110 and a controller 120. Based on design requirements, the non-volatile memory 110 may be an NAND flash memory or other non-volatile memory circuits/devices. The controller 120 is coupled to the non-volatile memory 110. When the host 10 sends one write command, the controller 120 can perform an error checking and correcting (a.k.a. ECC) method to convert a raw data of the host 10 into an encoded data (or known as a codeword). Based on design requirements, the ECC method may be a BCH (Bose-Chaudhuri-Hocquengh) algorithm, a LDPC (Low Density Parity Check) algorithm, or other ECC algorithms. The BCH algorithm and the LDPC algorithm belong to the prior art, and thus description regarding the same is not repeated hereinafter. The controller 120 can address the non-volatile memory 110 according to logical addresses of the write command, so as to write the encoded data into the non-volatile memory 110.

The followings take the LDPC algorithm as an example. The controller 120 can perform the LDPC algorithm to convert the raw data of the host 10 into a plurality of parity bits. The raw data and the parity bits are used together as the codeword (the encoded data). According to the logical addresses of the write command, the controller 120 can address the non-volatile memory 110 and writes the codeword (the encoded data) into the non-volatile memory 110. Implementation regarding other ECC algorithms (e.g., the BCH algorithm) may be deduced with reference to the related description of the LDPC algorithm, which is not repeated hereinafter.

After one read command is sent by the host 10, the controller 120 can address the non-volatile memory 110 according to the logical addresses of the read command, so as to read one corresponding encoded data from the non-volatile memory 110. The controller 120 can perform the ECC method for the encoded data, so as to obtain a decoded data (the raw data). The ECC method can correct errors occurred during the transmission process.

The followings take the LDPC algorithm as an example. After one LDPC decoding is complete, the controller 120 can obtain one decoded codeword v. The controller 120 can perform a syndrome operation to check the decoded codeword v by using Equation 1 below, so as to obtain a syndrome $[c_0\ c_1\ \ldots\ c_{m-1}]$. H in Equation 1 is a parity check matrix having a property of sparse matrix. Elements in the parity check matrix H are 1 or 0, and the number of the elements being 1 is far less than the number of the elements being 0. The parity check matrix H belongs to the prior art, which is not described hereinafter. If the syndrome $[c_0\ c_1\ \ldots\ c_{m-1}]$ is not a 0 vector (0 matrix, i.e., all the elements $c_0$ to $c_{m-1}$ are 0), the controller 120 can perform an iterative operation (perform the LDPC decoding once again) on the decoded codeword v, so as to obtain a new decoded codeword v. The controller 120 can check the new decoded codeword v using Equation 1 again to obtain a new syndrome $[c_0\ c_1\ \ldots\ c_{m-1}]$. In this way, the iterative operation will be performed multiple times until the syndrome $[c_0\ c_1\ \ldots\ c_{m-1}]$ is the 0 vector (0 matrix) so that the iterative operation can be terminated (i.e., the LDPC decoding on the decoded codeword is successful). When the LDPC decoding on the decoded codeword is successful, the controller 120 can return the decoded data (the decoded codeword v) to the host 10.

$$v \cdot H^T = [v_0\ v_1\ \cdots\ v_{n-1}] \cdot \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}^T \quad \text{Equation 1}$$

$$= [c_0\ c_1\ \cdots\ c_{m-1}]$$

Figure 2:
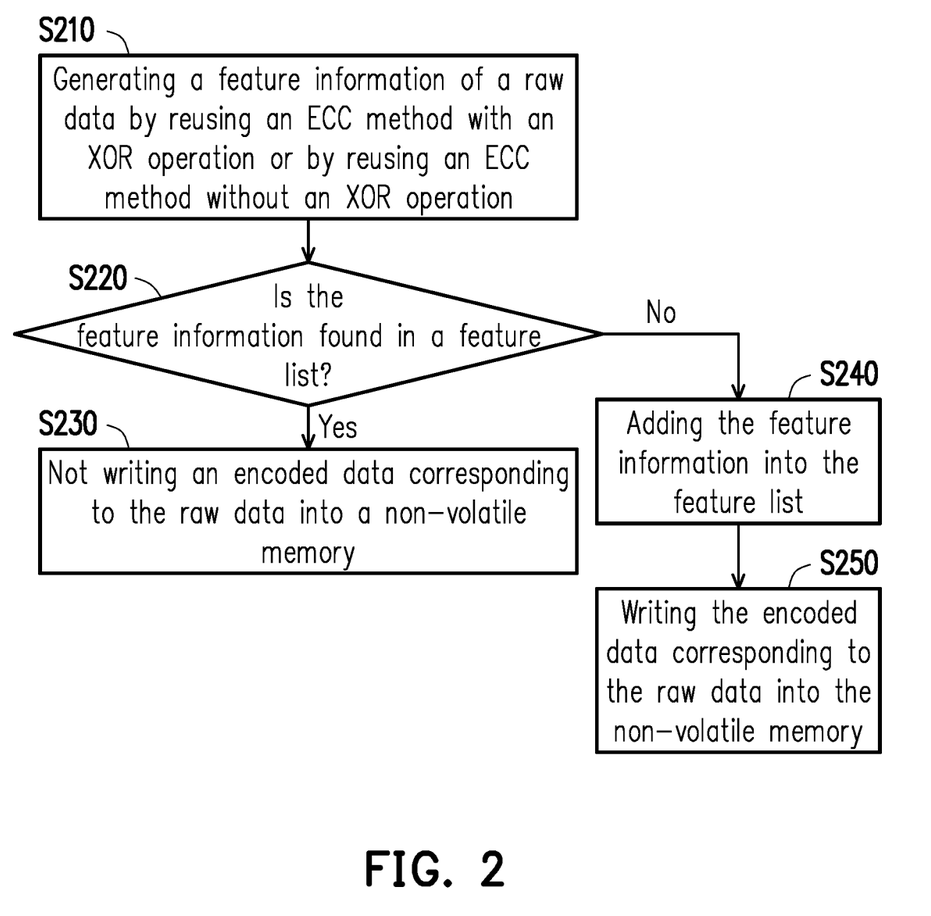
FIG. 2 is a schematic flowchart illustrating a data de-duplication method according to an embodiment of the invention.

FIG. 2 is a schematic flowchart illustrating a data de-duplication method according to an embodiment of the invention. With reference to FIG. 1 and FIG. 2, the controller 120 can perform the data de-duplication method to reduce a number of times that the same encoded data is repeatedly written to the non-volatile memory 110. In step S210, the controller 120 can generate a feature information corresponding to the raw data of the host 10 by reusing the ECC method. Any calculating operation and/or any calculating result of the ECC method can be reused to generate the feature information in step S210.

Part or all of the parity bits generated by reusing the ECC method can be used as the feature information in step S210. For instance, it is assumed that a data volume of the raw data is 4 KB. If the data volume processed by the ECC method each time is 1 KB, the raw data may be divided into 4 parts D1, D2, D3 and D4, and a data volume of each part is 1 KB. The ECC method can perform an ECC calculation for the part D1 to obtain one set of parity bits P1. By analogy, the ECC method can perform the ECC calculation for the other parts D2, D3 and D4 to obtain three sets of parity bits P2, P3 and P4. Based on design requirements, in some embodiments, all of the parity bits P1, P2, P3 and P4 can be reused as the feature information of the raw data in step S210.

In some other embodiments, part of the parity bits P1, P2, P3 and P4 can be reused as the feature information of the raw data in step S210. For example, a first half (or a second half) of P1, a first half (or a second half) of P2, a first half (or a second half) of P3 and a first half (or a second half) of P4 can be taken as the feature information of the raw data in step S210. As another example, contents at odd positions (or even positions) of P1, contents at odd positions (or even positions) of P2, contents at odd positions (or even positions) of P3 and contents at odd positions (or even positions) of P4 can be taken as the feature information of the raw data in step S210.

In still some other embodiments, the feature information of the raw data may be generated by performing a logic operation using part or all of parity bits of the encoded data corresponding to the raw data in step S210. For instance, assuming that the data volume of the raw data is 4 KB and the data volume processed by the ECC method each time is 1 KB, the raw data may be divided into 4 parts D1, D2, D3 and D4. The ECC method can perform the ECC calculation for each of the 4 parts D1, D2, D3 and D4 to obtain four sets of parity bits P1, P2, P3 and P4. The feature information of the raw data may be generated by performing an exclusive OR (XOR) operation using P1, P2, P3 and P4 in step S210. Given that the data volume of the raw data is 4 KB and the data volume processed by the ECC method each time is 4 KB, the ECC method can perform the ECC calculation for the raw data to obtain one set of parity bits P. This set of parity bits P may be divided into n parts (n may be decided based on design requirements). For example, P is divided into four sets of parity bits P5, P6, P7 and P8. The feature information of the raw data may be generated by performing the logic operation (e.g., the XOR operation) using P5, P6, P7 and P8 in step S210.

In yet some other embodiments, one or more syndromes of the raw data may be generated by performing a syndrome operation of the ECC method for the raw data in step S210. For instance, in the example of the LDPC algorithm, the syndrome operation may be LDPC syndrome operation in Equation 1 above, but the decoded codeword v in Equation 1 is replaced by the raw data. That is to say, the syndrome of the raw data is obtained by multiplying the raw data by $H^T$.

Part or all of bits of the syndromes of the raw data can be used as the feature information in step S210. For instance, assuming that the data volume of the raw data is 4 KB and the data volume processed by the ECC method each time is 1 KB, the raw data may be divided into 4 parts D1, D2, D3 and D4. A syndrome S1 of D1 may be generated by performing the syndrome operation of the ECC method for the part D1 in step S210. For instance, in the example of the LDPC algorithm, the syndrome operation may be $S1=D1*H^T$ (see Equation 1 above for more details) and by which the syndrome S1 of D1 may be obtained. By analogy, three syndromes S2, S3 and S4 may be generated by respectively performing the syndrome operation of the ECC method for the other parts D2, D3 and D4 in step S210. Based on design requirements, in some embodiments, all of bits of the syndromes S1, S2, S3 and S4 can be used as the feature information of the raw data in step S210.

In some other embodiments, part of bits of the syndromes S1, S2, S3 and S4 can be used as the feature information of the raw data in step S210. For example, a first half (or a second half) of S1, a first half (or a second half) of S2, a first half (or a second half) of S3 and a first half (or a second half) of S4 can be taken as the feature information of the raw data in step S210. As another example, contents at odd positions (or even positions) of S1, contents at odd positions (or even positions) of S2, contents at odd positions (or even positions) of S3 and contents at odd positions (or even positions) of S4 can be taken as the feature information of the raw data in step S210.

In still some other embodiments, the feature information of the raw data may be generated by performing the logic operation using part or all of bits of the syndromes of the raw data in step S210. For instance, assuming that the data volume of the raw data is 4 KB and the data volume processed by the ECC method each time is 1 KB, the raw data may be divided into 4 parts D1, D2, D3 and D4. The ECC method can perform the syndrome operation for each of the 4 parts D1, D2, D3 and D4 to obtain four syndromes S1, S2, S3 and S4. The feature information of the raw data may be generated by performing the XOR operation using S1, S2, S3 and S4 in step S210. Given that the data volume of the raw data is 4 KB and the data volume processed by the ECC method each time is 4 KB, the ECC method can perform the syndrome operation for the raw data to obtain one syndrome S. This syndrome S may be divided into n parts (n may be decided based on design requirements). For example, S may be divided into four syndromes S5, S6, S7 and S8. The feature information of the raw data may be generated by performing the logic operation (e.g., the XOR operation) using S5, S6, S7 and S8 in step S210.

With reference to FIG. 2, in step S220, the controller 120 can look up the feature list using the feature information of step S210. A data structure of the feature list is not particularly limited by the present embodiment. Based on design requirements, in some embodiments, the data structure of the feature list is a data link or other structures. Each record in the feature list contains a feature field. When the feature information of the raw data is found in the feature list by the controller 120, the controller 120 does not write the encoded data corresponding to the raw data into the non-volatile memory 110 (step S230). When the feature information of the raw data is not found in the feature list by the controller 120, the controller 120 adds the feature information of the raw data into the feature list (step S240) and the controller 120 writes the encoded data corresponding to the raw data into the non-volatile memory 110 (step S250).

Figure 3:
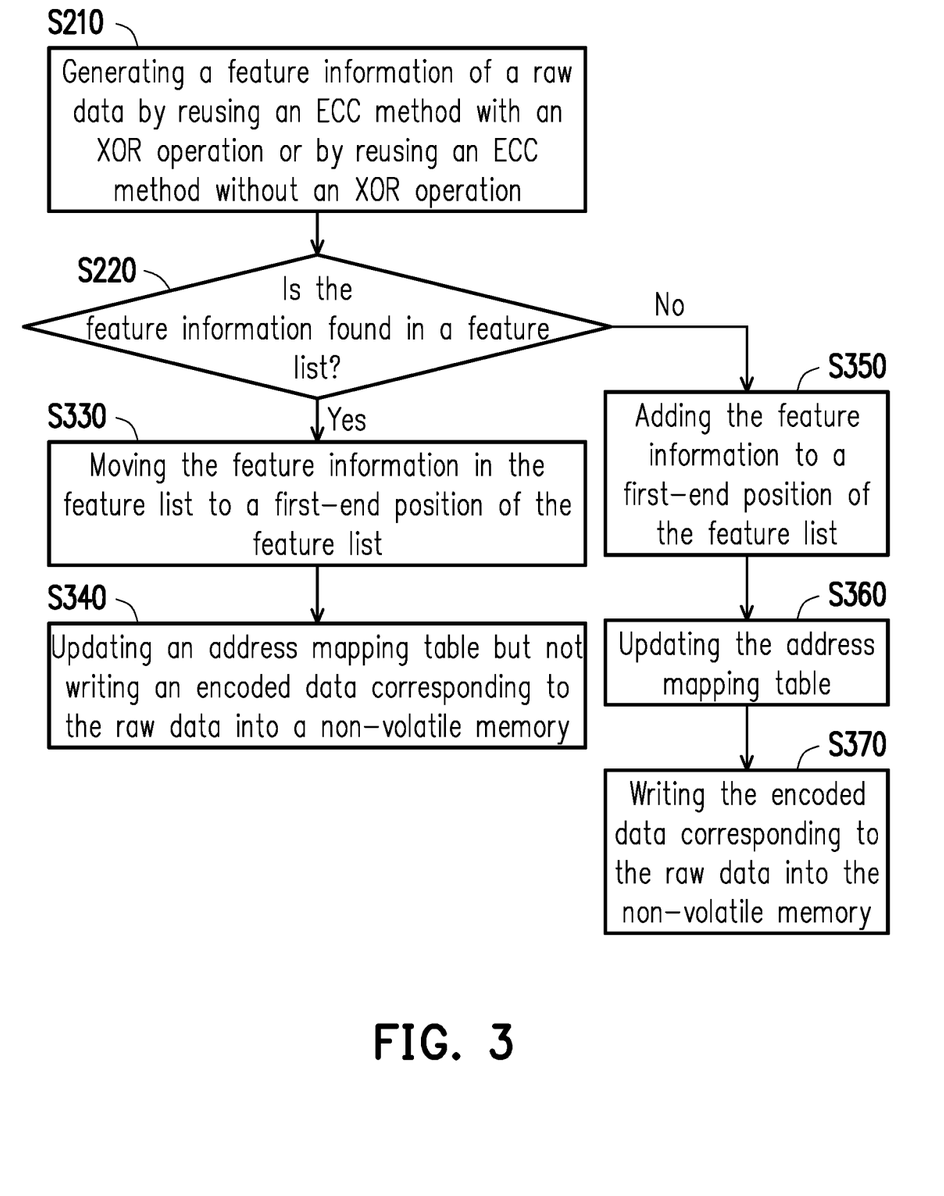
FIG. 3 is a schematic flowchart illustrating a data de-duplication method according to another embodiment of the invention.

FIG. 3 is a schematic flowchart illustrating a data de-duplication method according to another embodiment of the invention. Steps S210 and S220 shown in FIG. 3 can refer to the related description of FIG. 2, which is not repeated hereinafter. Based on design requirements, in some embodiments, the data structure of the feature list is a data link or other structures. Each record in the feature list contains a feature field and a physical address field. With reference to FIG. 1 and FIG. 3, when it is determined in step S220 that the feature information of the raw information can be found by the controller 120, the controller 120 will perform step S330. When it is determined in step S220 that the feature information of the raw data cannot be found by the controller 120, the controller 120 will perform step S350.

In step S330, the controller 120 can move one record having the feature information in the feature list to a first-end position of the feature list (e.g., moving to a head position of the feature list). In some other embodiments, the controller 120 can move one corresponding record matching the feature information in the feature list to a tail position of the feature list. In step S340, the controller 120 can update an address mapping table (which will be described in detail later) but does not write the corresponding encoded data into the non-volatile memory 110.

In step S350, the controller 120 can add the feature information to the first-end position of the feature list (e.g., adding to the head position of the feature list). In some application scenarios, a capacity of the feature list is limited. When the feature information is to be added to the first-end position (e.g., the head position) of the feature list but the feature list is already full, the controller 120 can discard a content at the second-end position of the feature list (e.g., discarding a content at the tail position of the feature list). In some other embodiments, the controller 120 can add the new feature information to the tail position of the feature list and discard a content at the head position of the feature list. In step S360, the controller 120 can update the address mapping table (which will be described in detail later). In step S370, the controller 120 can write the encoded data corresponding to the raw data into the non-volatile memory 110.

For instance, it is assumed herein that the host 10 sends one write command (a first write command) for writing the raw data into a logical address LADD1 in a previous time, and then sends another write command (a second write command) for writing the same raw data into a logical address LADD2 in a current time. It assumed that the logical address LADD1 corresponds to a physical address PADD1 and the logical address LADD2 corresponds to a physical address PADD2. In said previous time, a raw data of the first write command is converted into a feature information CH1 in step S210, and it is determined in step S220 that the feature list does not include a related record of the feature information CH1. Accordingly, the controller 120 adds a correspondence relation between the feature information CH1 and the physical address PADD1 into the feature list (step S350), the controller 120 adds a correspondence relation between the logical address LADD1 and the physical address PADD1 to the address mapping table (step S360), and the controller 120 writes the encoded data corresponding to the raw data into the non-volatile memory 110 at the physical address PADD1. In said current time, a raw data of the second write command is converted into the feature information CH1 in step S210, and it is determined in step S220 that the feature list includes the related record of the feature information CH1. In other words, the feature list records that the encoded data corresponding to the feature information CH1 has been written into the physical address PADD1. Accordingly, the controller 120 moves this record including the feature information CH1 in the feature list to the first-end position of the feature list (step S330), and the controller 120 adds a correspondence relation between the logical address LADD2 and the physical address PADD1 to the address mapping table (step S340). However, the controller 120 does not write the encoded data corresponding to the same raw data of the second write command into the non-volatile memory 110 at the physical address PADD2. By doing so, the controller 120 can reduce the number of times that the same encoded data is repeatedly written into the non-volatile memory 110.

It should be noted that, under different application scenarios, related functions of the non-volatile memory 110 and/or the controller 120 may be implemented in form of software, firmware or hardware by utilizing common programming languages (e.g., C or C++), hardware description languages (e.g., Verilog HDL or VHDL) or other suitable programming languages. The programming language capable of executing the related functions can be arranged into any known computer-accessible media such as magnetic tapes, semiconductor memories, magnetic disks or compact disks (e.g., CD-ROM or DVD-ROM); or the programming language may be transmitted via the Internet, a wired communication, a wireless communication or other communication mediums. Said programming language may be stored in the computer-accessible media, so that a computer processor can access/execute programming codes of the software (or the firmware). As for hardware implementation, in combination with the aspect disclosed by the embodiments of the invention, various logical blocks, modules and circuit used in one or more controllers, a microcontroller, an application-specific integrated circuit (ASIC), a digital signal processor (DSP), a field programmable gate array (FPGA) and/or other processing units may be utilized to realize or execute the function described in the invention. In addition, the apparatus and the method of the invention can also be implemented by a combination of software and hardware.

Figure 4:
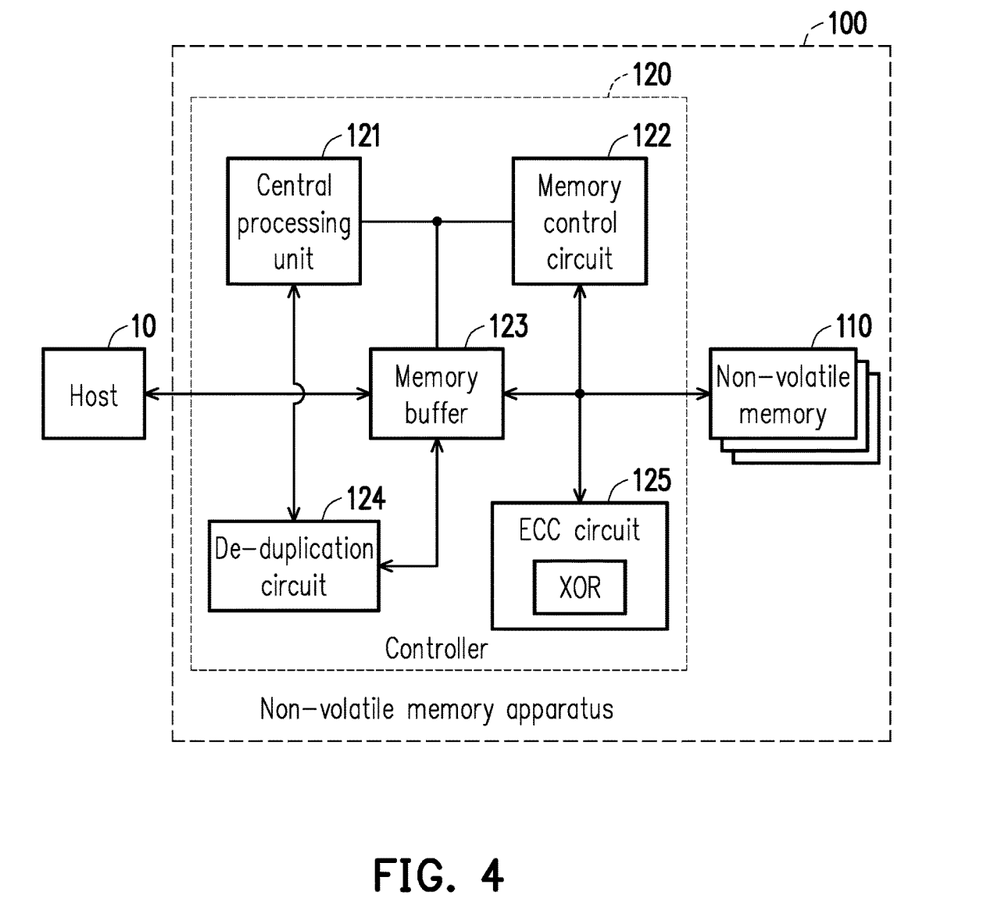
FIG. 4 is a circuit block diagram illustrating the controller depicted in FIG. 1 according to an embodiment of the invention.

FIG. 4 is a circuit block diagram illustrating the controller 120 depicted in FIG. 1 according to an embodiment of the invention. In the embodiment shown by FIG. 4, the controller 120 includes a central processing unit 121, a memory control circuit 122, a memory buffer 123, a de-duplication circuit 124 and an error checking and correcting (a.k.a. ECC) circuit 125. The central processing unit 121 and the memory buffer 123 are coupled to the host 10 via a communication interface. Based on design requirements, said communication interfaces include SCSI (small computer system interface), SAS (Serial Attached SCSI) interface, ESDI (Enhanced Small Disk Interface), SATA (serial advanced technology attachment) interface, PCI-express (peripheral component interconnect express) interface, IDE (integrated drive electronics) interface, USB (universal serial bus) interface, Thunderbolt interface or other interfaces. An interface structure between the host 10 and the non-volatile memory apparatus 100 is not particularly limited by the present embodiment.

When the host 10 sends the write command, the raw data to be written may be temporarily stored in the memory buffer 123, and the central processing unit 121 can convert/decode the write command (containing the logical addresses) of the host 10 into a corresponding internal control signal (containing the physical addresses of the non-volatile memory 110) and provides the internal control signal to the memory control circuit 122 and/or the memory buffer 123. An example of the memory buffer 123 includes a DRAM dynamic random access memory), a SRAM (static random access memory or other volatile memories. The ECC circuit 125 is coupled to the memory buffer 123 for receiving the raw data. The ECC circuit 125 can execute the ECC method (algorithm) to encode the raw data temporarily stored in the memory buffer 123 into the codeword (i.e., the encoded data). In some embodiments, the ECC circuit 125 can execute the BCH algorithm, the LDPC algorithm or other ECC algorithms.

The ECC circuit 125 can generate the feature information of the raw data to be written by reusing the ECC method, and stores the feature information into the memory buffer 123. The de-duplication circuit 124 receives the feature information generated by the ECC circuit 125 via the memory buffer 123. The de-duplication circuit 124 looks up the feature list using the feature information so as to obtain a look-up result. The central processing unit 121 is coupled to the de-duplication circuit 124 for receiving the look-up result. When the feature information is found in the feature list, the central processing unit 121 does not write the encoded data into the non-volatile memory 110. When the feature information is not found in the feature list, the central processing unit 121 sends the internal control signal to the memory control circuit 122 and the de-duplication circuit 124. According to the internal control signal, the memory control circuit 122 can address/control the non-volatile memory 110, so as to write the encoded data into the non-volatile memory 110. According to the internal control signal, the de-duplication circuit 124 adds the feature information into the feature list. The data de-duplication method performed by the central processing unit 121 and the de-duplication circuit 124 may refer to the related description of FIG. 2 or FIG. 3, which is not repeated hereinafter.

When the host 10 sends the read command, the central processing unit 121 can convert/decode the read command (containing the logical addresses) of the host 10 into a corresponding internal control command (containing the physical addresses of the non-volatile memory 110). According to the internal control signal, the memory control circuit 122 can address/control the non-volatile memory 110, so as to read the codeword (the encoded data) from the non-volatile memory 110. The ECC circuit 125 can execute the ECC algorithm to decode the codeword into the data and temporarily store the decoded data into the memory buffer 123. Then, the central processing unit 121 can return the data temporarily stored in the memory buffer 123 to the host 10.

Figure 5:
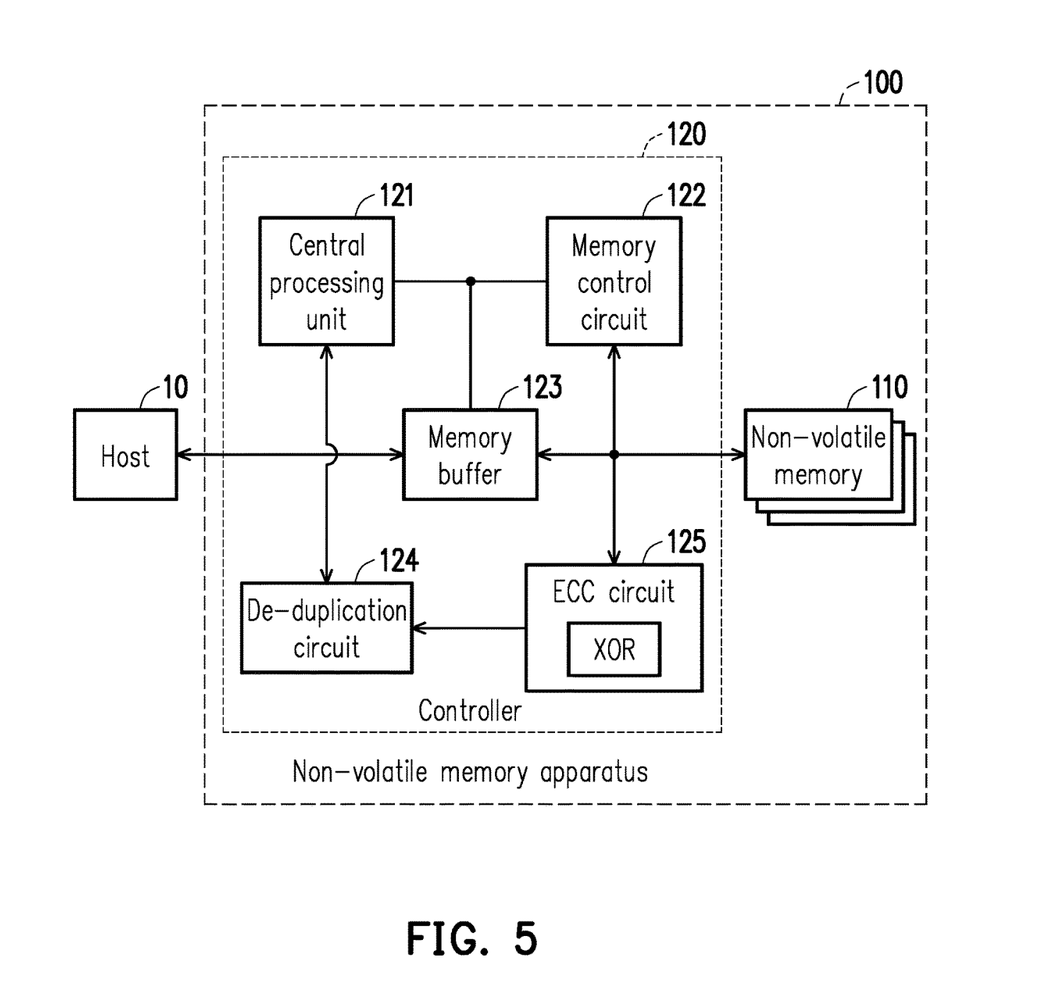
FIG. 5 is a circuit block diagram illustrating the controller depicted in FIG. 1 according to another embodiment of the invention.

FIG. 5 is a circuit block diagram illustrating the controller 120 depicted in FIG. 1 according to another embodiment of the invention. In the embodiment shown by FIG. 5, the controller 120 includes a central processing unit 121, a memory control circuit 122, a memory buffer 123, a de-duplication circuit 124 and an ECC circuit 125. The central processing unit 121, the memory control circuit 122, the memory buffer 123, the de-duplication circuit 124 and the ECC circuit 125 shown in FIG. 5 may refer to the related description of FIG. 4, which is not repeated hereinafter. In the embodiment shown by FIG. 5, the de-duplication circuit 124 is coupled to the ECC circuit 125 for directly receiving the feature information generated by the ECC circuit 125.

In summary, the non-volatile memory apparatus 100 and the data de-duplication method thereof described in the foregoing embodiments can generate the feature information corresponding to the raw data by reusing the existing ECC method. Upon comparing the feature information with feature list, the controller 120 can learn about whether the encoded data corresponding to the raw data has been written into the non-volatile memory 110. As a result, the non-volatile memory apparatus 100 and the data de-duplication method thereof described in the foregoing embodiments are capable of reducing the number of times that the same encoded data is repeatedly written into the non-volatile memory 110.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory apparatus, comprising:
  a non-volatile memory; and
  a controller, coupled to the non-volatile memory, configured to perform an error checking and correcting method to convert a raw data into an encoded data, and configured to perform a data de-duplication method to reduce a number of times that the same encoded data is repeatedly written into the non-volatile memory, wherein the data de-duplication method comprises:
    generating a feature information corresponding to the raw data by reusing the error checking and correcting method;
    looking up a feature list using the feature information;
    not writing the encoded data corresponding to the raw data into the non-volatile memory when the feature information is found in the feature list; and
    adding the feature information corresponding to the raw data into the feature list and writing the encoded data corresponding to the raw data into the non-volatile memory when the feature information is not found in the feature list.

2. The non-volatile memory apparatus as recited in claim 1, wherein the controller comprises:
  a memory buffer, configured to temporarily store the raw data;
  an error checking and correcting circuit, coupled to the memory buffer for receiving the raw data, and configured to perform the error checking and correcting method so as to obtain the encoded data and the feature information;
  a de-duplication circuit, receiving the feature information generated by the error checking and correcting circuit, wherein the de-duplication circuit looks up the feature list using the feature information so as to obtain a look-up result; and
  a central processing unit, coupled to the de-duplication circuit for receiving the look-up result, wherein the central processing unit does not write the encoded data into the non-volatile memory when the feature information is found in the feature list, and the central processing unit writes the encoded data into the non-volatile memory and controls the de-duplication circuit to add the feature information into the feature list when the feature information is not found in the feature list.

3. The non-volatile memory apparatus as recited in claim 1, wherein the step of generating the feature information corresponding to the raw data comprises:
  using part or all of parity bits of the encoded data corresponding to the raw data as the feature information.

4. The non-volatile memory apparatus as recited in claim 1, wherein the step of generating the feature information corresponding to the raw data comprises:
  generating the feature information by performing a logic operation using part or all of parity bits of the encoded data corresponding to the raw data.

5. The non-volatile memory apparatus as recited in claim 4, wherein the logic operation comprises an exclusive OR operation.

6. The non-volatile memory apparatus as recited in claim 1, wherein the step of generating the feature information corresponding to the raw data comprises:
  performing a syndrome operation of the error checking and correcting method for the raw data to generate at least one syndrome of the raw data; and
  using part or all of bits of the at least one syndrome as the feature information.

7. The non-volatile memory apparatus as recited in claim 6, wherein the syndrome operation comprises a low density parity check syndrome operation.

8. The non-volatile memory apparatus as recited in claim 1, wherein the step of generating the feature information corresponding to the raw data comprises:
  performing a syndrome operation of the error checking and correcting method for the raw data to generate at least one syndrome of the raw data; and
  generating the feature information by performing a logic operation using part or all of bits of the at least one syndrome.

9. The non-volatile memory apparatus as recited in claim 8, wherein the logic operation comprises an exclusive OR operation.

10. The non-volatile memory apparatus as recited in claim 1, wherein the step of looking up the feature list comprises:
   moving the feature information in the feature list to a first end-position of the feature list when the feature information is found in the feature list; and
   adding the feature information to the first-end position of the feature list when the feature information is not found in the feature list.

11. The non-volatile memory apparatus as recited in claim 10, wherein the step of looking up the feature list further comprises:
   discarding a content in a second-end position of the feature list when adding the feature information to the first-end position of the feature list.

12. A data de-duplication method of a non-volatile memory apparatus for reducing a number of times that an encoded data is repeatedly written into a non-volatile memory, wherein the non-volatile memory apparatus is configured to perform an error checking and correcting method to convert a raw data into the encoded data, and the data de-duplication method comprises:
   generating a feature information corresponding to the raw data by reusing the error checking and correcting method;
   looking up a feature list using the feature information;
   not writing the encoded data corresponding to the raw data into the non-volatile memory when the feature information is found in the feature list; and
   adding the feature information corresponding to the raw data into the feature list and writing the encoded data corresponding to the raw data into the non-volatile memory when the feature information is not found in the feature list.

13. The data de-duplication method as recited in claim 12, wherein the step of generating the feature information corresponding to the raw data comprises:
   using part or all of parity bits of the encoded data corresponding to the raw data as the feature information.

14. The data de-duplication method as recited in claim 12, wherein the step of generating the feature information corresponding to the raw data comprises:
   generating the feature information by performing a logic operation using part or all of parity bits of the encoded data corresponding to the raw data.

15. The data de-duplication method as recited in claim 14, wherein the logic operation comprises an exclusive OR operation.

16. The data de-duplication method as recited in claim 12, wherein the step of generating the feature information corresponding to the raw data comprises:
   performing a syndrome operation of the error checking and correcting method for the raw data to generate at least one syndrome of the raw data; and
   using part or all of bits of the at least one syndrome as the feature information.

17. The data de-duplication method as recited in claim 16, wherein the syndrome operation comprises a low density parity check syndrome operation.

18. The data de-duplication method as recited in claim 12, wherein the step of generating the feature information corresponding to the raw data comprises:
   performing a syndrome operation of the error checking and correcting method for the raw data to generate at least one syndrome of the raw data; and
   generating the feature information by performing a logic operation using part or all of bits of the at least one syndrome.

19. The data de-duplication method as recited in claim 18, wherein the logic operation comprises an exclusive OR operation.

20. The data de-duplication method as recited in claim 12, wherein the step of looking up the feature list comprises:
   moving the feature information in the feature list to a first end-position of the feature list when the feature information is found in the feature list; and
   adding the feature information to the first-end position of the feature list when the feature information is not found in the feature list.

21. The data de-duplication method as recited in claim 20, wherein the step of looking up the feature list further comprises:
   discarding a content in a second-end position of the feature list when adding the feature information to the first-end position of the feature list.

* * * * *